(12) United States Patent
Yoon et al.

(10) Patent No.: US 10,203,433 B2
(45) Date of Patent: Feb. 12, 2019

(54) DISPLAY APPARATUS WITH A DISPLAY PANEL HAVING A FLAT DISPLAY AREA AND A CURVED DISPLAY AREA

(71) Applicant: Samsung Display Co., Ltd., Yongin-si, Gyeonggi-do (KR)

(72) Inventors: Daeho Yoon, Seoul (KR); Jaehoon Jung, Bucheon-si (KR); Youngsik Yoon, Seoul (KR); Jonghwan Cho, Ansan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 12 days.

(21) Appl. No.: 15/258,944

(22) Filed: Sep. 7, 2016

(65) Prior Publication Data

US 2017/0192140 A1    Jul. 6, 2017

(30) Foreign Application Priority Data

Jan. 5, 2016 (KR) .................. 10-2016-0001026

(51) Int. Cl.
*G02B 5/04* (2006.01)

(52) U.S. Cl.
CPC .................... *G02B 5/045* (2013.01)

(58) Field of Classification Search
USPC ........................................... 359/837
See application file for complete search history.

(56) References Cited

U.S. PATENT DOCUMENTS

| 9,483,964 | B2* | 11/2016 | Choi | G09F 9/30 |
| 2014/0346474 | A1* | 11/2014 | Jeong | H01L 27/32 257/40 |
| 2017/0092703 | A1* | 3/2017 | Bae | H01L 27/3232 |
| 2018/0113241 | A1* | 4/2018 | Powell | G02B 5/045 |

FOREIGN PATENT DOCUMENTS

| KR | 10-13-1320384 | 10/2013 |
| KR | 10-1320384 B1 | 10/2013 |
| KR | 10-2014-0048739 | 4/2014 |
| KR | 10-2015-0007872 | 1/2015 |

* cited by examiner

*Primary Examiner* — Jennifer D. Carruth
(74) *Attorney, Agent, or Firm* — Lewis Roca Rothgerber Christie LLP

(57) ABSTRACT

A display apparatus includes: a display panel including a flat display area and a curved display area; and an optical sheet on the display panel. The optical sheet includes a first optical pattern overlapping the curved display area and configured to change a traveling direction of light exiting from the display panel.

18 Claims, 11 Drawing Sheets

DISPLAY APPARATUS WITH A DISPLAY PANEL HAVING A FLAT DISPLAY AREA AND A CURVED DISPLAY AREA

CROSS-REFERENCE TO RELATED APPLICATION

This U.S. non-provisional patent application claims priority to and the benefit of Korean Patent Application No. 10-2016-0001026, filed on Jan. 5, 2016 in the Korean Intellectual Property Office, the contents of which are hereby incorporated by reference in their entirety.

BACKGROUND

1. Field

The present disclosure relates to a display apparatus.

2. Description of the Related Art

An organic light emitting display includes an organic light emitting diode and a pixel circuit, which are disposed in each pixel area on a substrate. The organic light emitting display displays an image by using light emitted from organic light emitting diodes. The organic light emitting display is self-emissive, and thus, can display an image without using a backlight (e.g., a backlight unit), thereby reducing thickness and weight of the organic light emitting display.

When a polymer film is used as (e.g., is included in or is used to form) the substrate of an organic light emitting display, the organic light emitting display is flexible. A flexible organic light emitting display may include a curved portion. The organic light emitting display may be variously shaped and may include, for example, a flat portion and the curved portion or may include a plurality of curved portions that are consecutively connected to each other.

SUMMARY

The present disclosure is directed toward a curved display apparatus having improved display quality.

An embodiment of the inventive concept provides a display apparatus including: a display panel including a flat display area and a curved display area; and an optical sheet on the display panel. The optical sheet includes a first optical pattern overlapping the curved display area and configured to change a traveling direction of light exiting from the display panel.

The first optical pattern may include a plurality of first prisms.

The display panel may include an organic light emitting display panel.

The first prisms may be on the curved display area of the display panel and arranged along a direction, and ones of the first prisms may have shapes different from each other.

The first prisms may be on the curved display area and arranged along a direction, and ones of the first prisms may have sizes different from each other.

Each of the first prisms may have a right-angled triangular shape.

The curved display area may be at one end of the display panel, and each of the first prisms may have an inclination surface inclined toward the one end of the display panel. An inclination angle between the inclination surface and a bottom surface of the first prisms may increase as a distance between the one end of the display panel and the first prisms decreases.

The display apparatus may further include a window on the optical sheet, and the optical sheet may be between the display panel and the window.

The display apparatus may further include a polarizing plate between the optical sheet and the window.

The display apparatus may further include a filling agent between the optical sheet and the polarizing plate.

The display apparatus may further include a plurality of optical sheets. The display panel may further include a plurality of curved display areas, and ones of the optical sheets may overlap respective ones of the curved display areas.

The display panel may further include a plurality of curved display areas. The flat display area may be between ones of the curved display areas, and the optical sheet may further include a dummy layer on the flat display area of the display panel.

Another embodiment of the present disclosure provides a display apparatus including: a display panel including a curved display area; and a window on the display panel. The window includes a second optical pattern on an inner surface of the window and configured to change a traveling direction of light exiting from the display panel.

The second optical pattern may have an intaglio shape.

The second optical pattern may include a plurality of second prisms.

The second prisms may be on the curved display area and arranged along a direction, and ones of the second prisms may have shapes different from each other.

The second prisms may be on the curved display area and arranged along a direction, and ones of the second prisms may have sizes that are different from each other.

Each of the second prisms may have a right-angled triangular shape.

The curved display area may be at one end of the display panel, and each of the second prisms may have an inclination surface inclined toward the one end of the display panel. An inclination angle between the inclination surface and a bottom surface of the second prisms may increase as a distance between the one end of the display panel and the second prisms decreases.

According to the above-described embodiments, a white angle difference (WAD) property of a curved display apparatus may be maintained (e.g., may not deteriorate) in the curved display area of the display apparatus. For example, the brightness and the variation of the color coordinate may be maintained in the curved display area of the display apparatus. As a result, the display quality of the display apparatus may be improved.

BRIEF DESCRIPTION OF THE DRAWINGS

The above and other aspects and features of the present disclosure will become readily apparent by reference to the following detailed description when considered in conjunction with the accompanying drawings, wherein.

DETAILED DESCRIPTION

Figure 1:
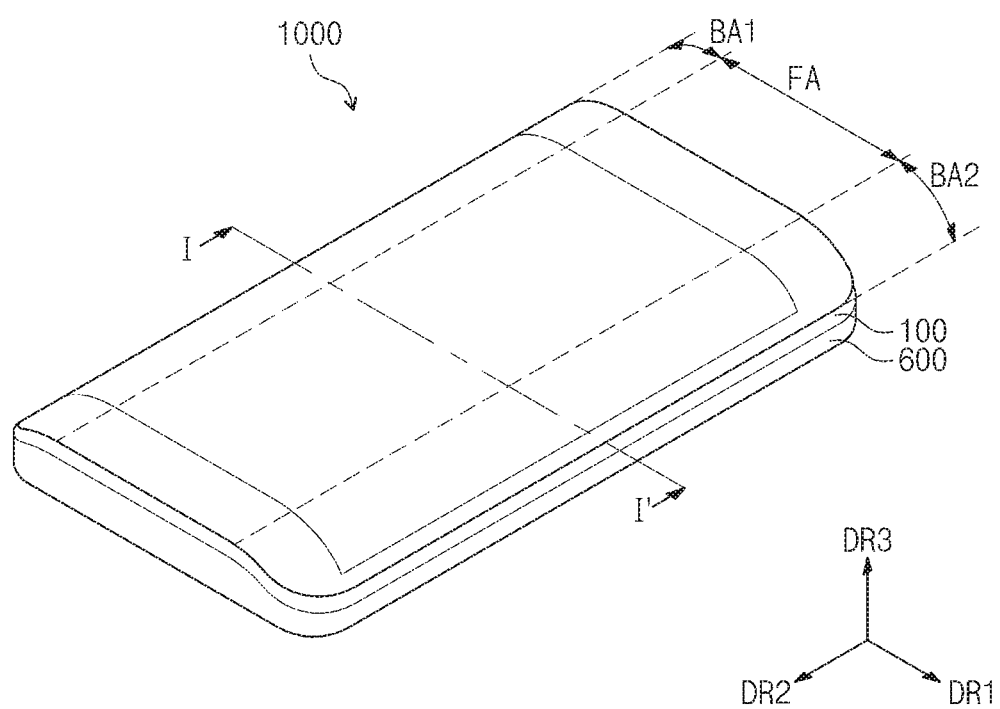
FIG. 1 is a perspective view of a display apparatus according to an exemplary embodiment of the present disclosure.

It will be understood that when an element or layer is referred to as being "on," "connected to," or "coupled to" another element or layer, it can be directly on, connected, or coupled to the other element or layer or intervening elements or layers may be present. When an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a" and "an" are intended to include the plural forms as well, unless the context clearly indicates otherwise. It will be further understood that the terms "comprises," "comprising," "includes," and/or "including", when used in this specification, specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained, in detail, with reference to the accompanying drawings.

FIG. 1 is a perspective view of a display apparatus 1000 according to an exemplary embodiment of the present disclosure.

FIG. 1 shows a mobile terminal as an example to which the display apparatus 1000 according to the present exemplary embodiment is applied. The mobile terminal may be, but is not limited to, a tablet personal computer, a smart phone, a personal digital assistant, a portable multimedia player, a game unit, a wrist-type electronic device, etc. In addition, the display apparatus 1000 may be applied to a large-size electronic device, such as a television set, an outdoor billboard, etc., or to small and medium-size electronic devices, such as a personal computer, a notebook computer, a car navigation unit, a camera, etc. However, the present invention is not limited thereto or thereby.

Referring to FIG. 1, the display apparatus 1000 has a partially curved shape. The display apparatus 1000 includes a flat part FA (e.g., a flat area or a flat portion) and curved parts BA1 and BA2 (e.g., curved areas or curved portions) connected to (e.g., extending from) the flat part FA.

The flat part FA is substantially parallel to a plane (e.g., an imaginary surface) defined by a first direction DR1 and a second direction DR2, and a normal direction of the flat part FA is substantially parallel to a third direction DR3. Front and rear surfaces of each member of the display apparatus 1000 face the third direction DR3.

The curved parts BA1 and BA2 include a first curved part BA1 and a second curved part BA2. The first and second curved parts BA1 and BA2 are disposed to face each other such that the flat part FA is disposed between the first and second curved parts BA1 and BA2. For example, the first curved part BA1 is disposed at one end of the display apparatus 1000 in the first direction DR1, and the second curved part BA2 is disposed at the other end of the display apparatus 1000 in the first direction DR1.

Each of the first and second curved parts BA1 and BA2 has a curved surface curved in the first direction DR1 when viewed in a plan view and extends substantially parallel to the second direction DR2. FIG. 1 shows two curved parts BA1 and BA2, but the number of curved parts is not limited thereto. According to another embodiment, the display apparatus 1000 may include only one curved part from among the first and second curved parts BA1 and BA2. In addition, according to other embodiments, the display apparatus 1000 may include three or more curved parts.

Figure 2:
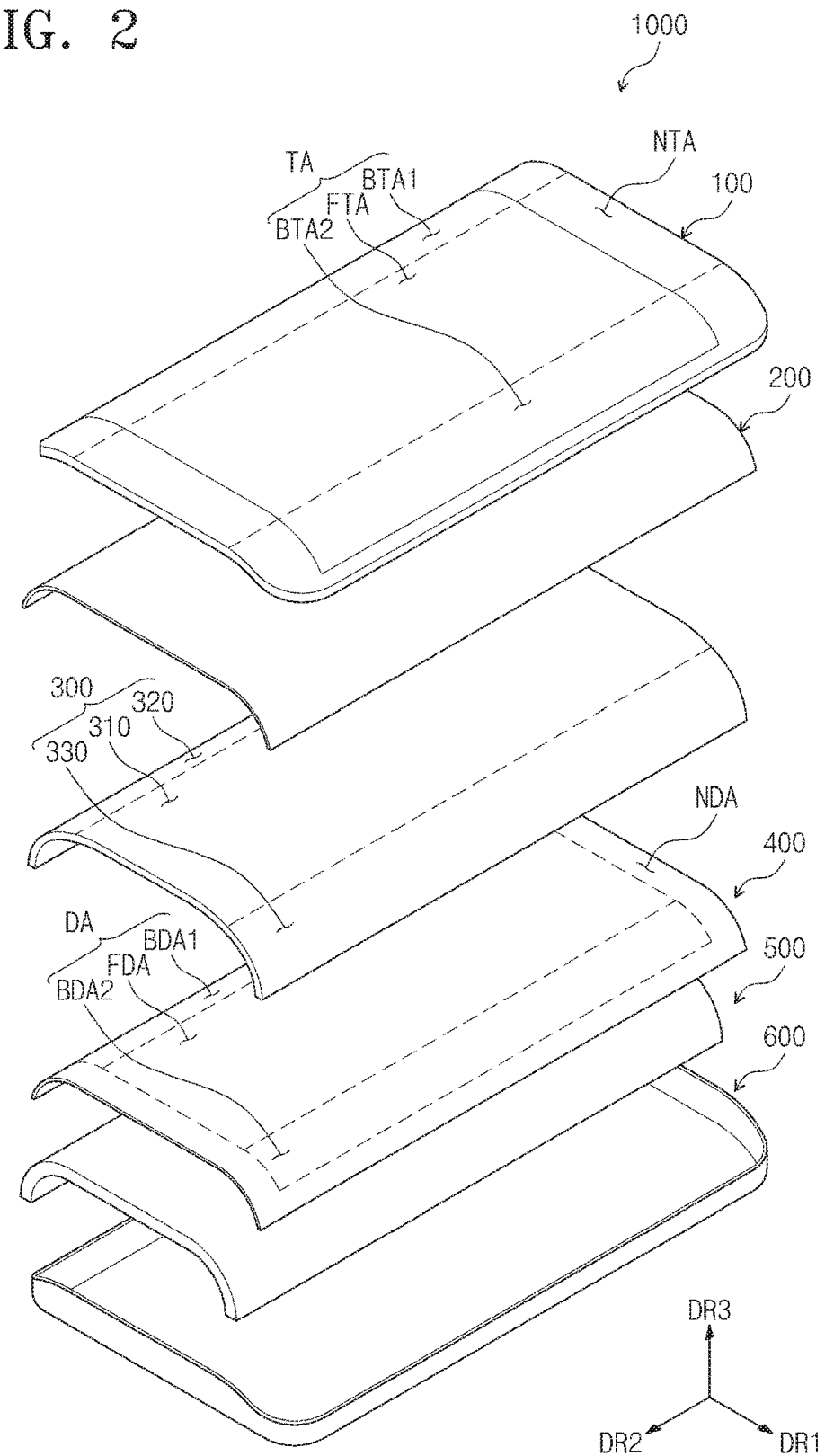
FIG. 2 is an exploded perspective view of the display apparatus shown in FIG. 1.
Figure 3:
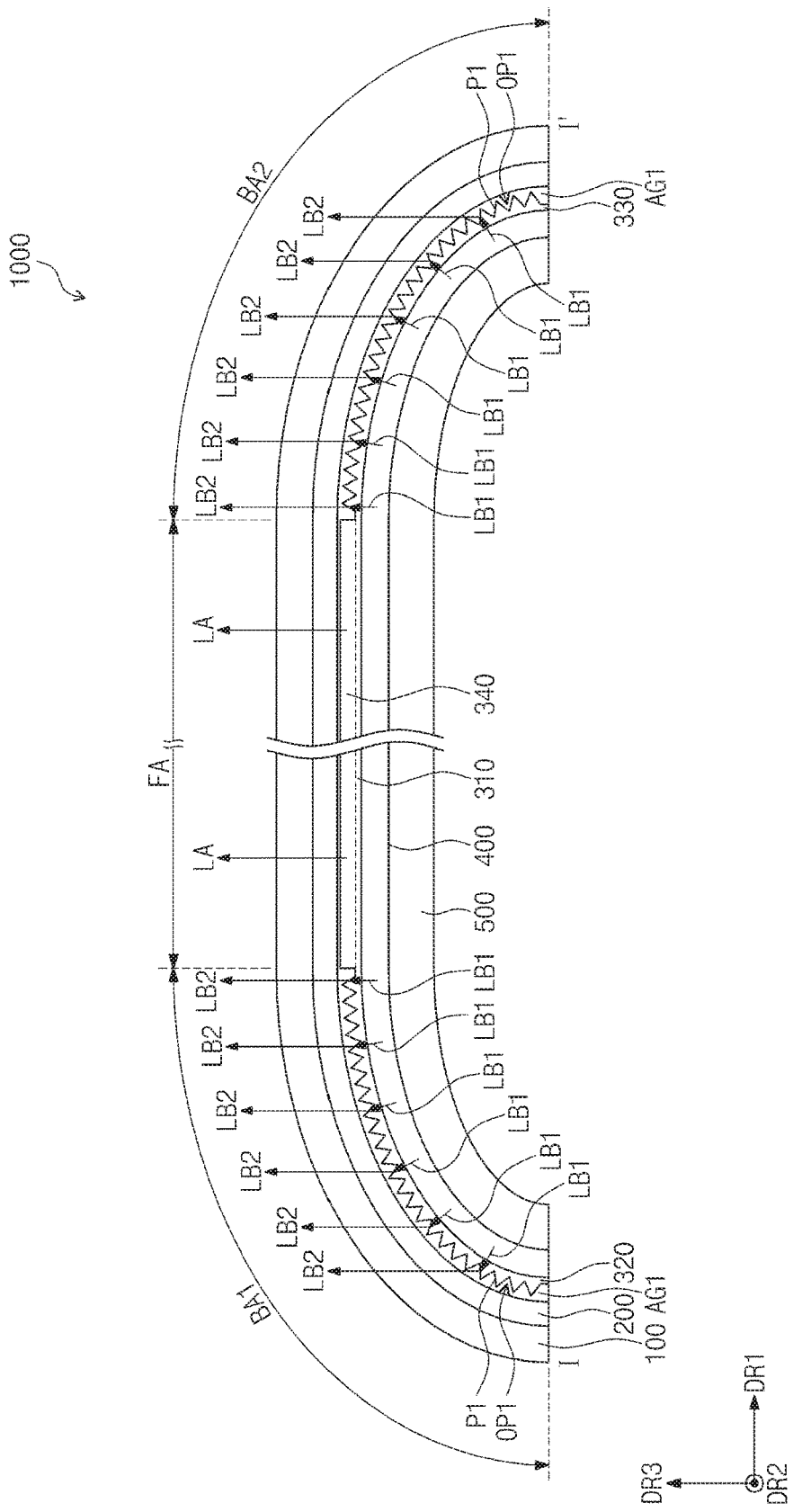
FIG. 3 is a cross-sectional view taken along the line I-I' of FIG. 1.

FIG. 2 is an exploded perspective view of the display apparatus 1000 shown in FIG. 1, and FIG. 3 is a cross-sectional view taken along the line I-I' of FIG. 1.

Referring to FIGS. 2 and 3, the display apparatus 1000 includes a window 100 (e.g., a window member), a polarizing plate 200, an optical sheet 300, a display panel 400, a cover 500 (e.g., a cover member or a cover panel), and a case 600.

Each of the window 100, the polarizing plate 200, the display panel 400, and the cover 500 includes a flat part (e.g., a flat portion) and a plurality of curved parts (e.g., a plurality of curved portions). The flat part of each of the window 100, the polarizing plate 200, the display panel 400, and the cover 500 overlaps the flat part FA of the display apparatus 1000, and the curved parts of each of the window 100, the display panel 400, and the cover 500 overlap the curved parts BA1 and BA2.

For convenience of explanation, the flat part FA and the curved parts BA1 and BA2 may describe or refer to the flat part and the curved parts of each of the window 100, the polarizing plate 200, the display panel 400, and the cover 500. For instance, the flat part of the display panel may mean a flat part or portion of the display panel 400.

The window 100 includes a light transmission area TA for transmitting an image displayed by the display panel 400 and a light blocking area NTA disposed adjacent to the light transmission area TA. The light transmission area TA has a substantially rectangular shape. The light blocking area NTA is disposed to surround (e.g., surround a periphery of) the light transmission area TA.

A portion of the light transmission area TA is in the flat part FA, and another portion (e.g., the remaining portion or portions) of the light transmission area TA is in the first and second curved portions BA1 and BA2. The portion of the light transmission area TA that is in the flat part FA may be referred to as a flat light transmission area FTA, and the other portions of the light transmission area TA that are in the first and second curved parts BA1 and BA2 may be referred to as first and second curved light transmission areas BTA1 and BTA2.

The polarizing plate 200 is disposed under the window 100. The polarizing plate 200 prevents or reduces the occurrence of external light being reflected and polarizes the light exiting (e.g., emitted from) the display panel 400. In some embodiments, the polarizing plate 200 may be omitted from the display apparatus 1000.

The display apparatus 1000 may further include a touch panel. In such embodiments, the touch panel is disposed between the window 100 and the polarizing plate 200. The touch panel may be a resistive film-type touch panel, an electrostatic capacitive-type touch panel, or an electromagnetic induction-type touch panel and obtains or generates coordinate information corresponding to a position at which a touch event occurs.

The display panel 400 is disposed under the polarizing plate 200. The display panel 400 includes a display area DA in which the image is displayed and a non-display area NDA disposed adjacent to the display area DA. The display area DA has a substantially rectangular shape. The non-display area NDA is disposed to surround (e.g., surround a periphery of) the display area DA.

A portion of the display area DA is in (e.g., is defined in) the flat part FA, and other portions of the display area DA are in (e.g., are defined in) the first and second curved parts BA1 and BA2. The portion of the display area DA in the flat part FA may be referred to as a flat display area FDA, and the portions of the display area DA in the first and second curved parts BA1 and BA2 may be referred to as first and second curved display areas BDA1 and BDA2, respectively.

The flat display area FDA of the display panel 400 corresponds to the flat light transmission area TDA. The first curved display area BDA1 of the display panel 400 corresponds to the first curved light transmission area BTA1 of the window 100, and the second curved display area BDA2 of the display panel 400 corresponds to the second curved light transmission area BTA2 of the window 100.

The display panel 400 may be an organic light emitting display panel, but it should not be limited thereto or thereby. For example, the display panel 400 may be a liquid crystal display panel or a plasma display panel.

The optical sheet 300 is disposed between the polarizing plate 200 and the display panel 400. The optical sheet 300 changes a direction of light LA and LB1 exiting from the display panel 400 (e.g., changes the direction of light LA and LB1 to a certain or specific direction). According to the present exemplary embodiment, the optical sheet 300 may be a light condensing sheet; however, it should not be limited thereto or thereby. In addition, one or more sheets, such as a diffusion sheet, a protective sheet, etc., for performing an optical function different from the optical sheet 300 may be further disposed on the optical sheet 300.

The optical sheet 300 includes a flat part 310 (e.g., a flat portion), a first curved part 320 (e.g., a first curved portion), and a second curved part 330 (e.g., a second curved portion). The flat part 310 is in (e.g., is defined in) the flat part FA, the first curved part 320 is in (e.g., is defined in) the first curved part BA1, and the second curved part 330 is in (e.g., is defined in) the second curved part BA2. The flat part 310 is disposed between the first curved part 320 and the second curved part 330.

According to the present exemplary embodiment, the light LA and LB1 travels in a direction substantially vertical with respect to a surface from which the light LA and LB1 exit (or are emitted). In addition, for convenience of explanation, traveling directions (e.g., emission directions) of the light LA, LB1, and LB2 represent light traveling in a certain direction from among the light components including the light LA, LB1, and LB2, and the light LA, LB1, and LB2 includes light components traveling in different directions.

The light LA from among the light LA and LB1 exits from (or is emitted from) the display panel 400 and travels toward the flat part 310, and the light LB1 from among the light LA and LB1 exits from (or is emitted from) the display panel 400 and travels toward the first and second curved parts 320 and 330.

For example, the light exits from (or is emitted from) the display panel 400 and travels toward the flat part 310, the first curved part 320, and the second curved part 330. The light incident on the flat part 310 may be referred to as a flat surface emitting light LA. The flat surface emitting light LA is incident on the flat part 310 in a direction substantially vertical with respect to (e.g., normal to) an interface between the portion of the display panel 400 corresponding to the flat display area FDA and the flat part 310, and then, the flat surface emitting light LA is incident on the polarizing plate 200 after passing through the flat part 310. The direction in which the flat surface emitting light LA travels is substantially parallel to the third direction DR3.

The light incident on the first and second curved parts 320 and 330 may be referred to as a first light LB1. The first light LB1 is incident on the first and second curved parts 320 and 330 along a direction substantially vertical with respect to (e.g., normal to) an interface between the portion of the display panel 400 corresponding to the first curved display area BDA1 and the first curved part 320 and between the portion of the display panel 400 corresponding to the second curved display area BDA2 and the second curved part 330. The first light LB1 is incident on the polarizing plate 200 after passing through the first and second curved parts 320 and 330.

Each of the first and second curved parts 320 and 330 includes a first optical pattern OP1. The first optical pattern OP1 refracts the light LB1 exiting (or emitted) from the first and second curved display areas BDA1 and BDA2 at the first and second curved parts BA1 and BA2 of the display panel 400.

For example, the first light LB1 is refracted by the first optical pattern OP1 and then reaches the polarizing plate 200. When the light refracted by the first optical pattern OP1 is referred to as a second light LB2, a direction in which the second light LB2 travels may be substantially parallel to the direction in which the flat surface emitting light LA travels due to an optical function of the first optical pattern OP1.

The first optical pattern OP1 includes a plurality of first prisms P1. According to the present exemplary embodiment, each of the prisms P1 has a substantially triangular shape when viewed in a cross-section. The shape and function of the first prisms P1 will be described in further detail with reference to FIGS. 4A and 4B.

The optical sheet 300 of the display apparatus 1000 may further include a dummy layer 340 disposed on the flat part 310. The dummy layer 340 has a height equal to or greater than a height of the first prisms P1. The dummy layer 340 compensates for a step difference between the flat part 310 and the first and second curved parts 320 and 330 due to the first prisms P1.

In the present exemplary embodiment, the dummy layer 340 does not have an optical function, but in other embodiments, the dummy layer 340 may include an optical pattern having a function different from that of the first optical pattern OP1.

In addition, the display apparatus 1000 may include a first air layer AG1 between the first prisms P1 and the polarizing plate 200. In some embodiments, the first air layer AG1 may be filled with a filling agent, such as a transparent polymer.

The cover 500 is attached to a rear surface of the display panel 400. The cover 500 includes a buffer member, a light block member, a heat discharge member, and/or a radiation member.

The buffer member absorbs impacts applied to the polarizing plate 200, the optical sheet 300, the display panel 400, and the window 100 to prevent the polarizing plate 200, the optical sheet 300, the display panel 400, and the window 100 from being damaged or to reduce damages thereto.

The light block member blocks external light from traveling to the display panel 400. The light block member absorbs or reflects the external light.

The heat discharge member discharges heat generated by the display panel 400. The heat discharge member may include graphite molecules.

The radiation member shields an electromagnetic interference. In addition, the radiation member discharges the heat generated by the display panel 400 in cooperation with the heat discharge member.

The case 600 is coupled to the window 100 to cover the polarizing plate 200, the optical sheet 300, the display panel 400, and the cover 500. The case 600 includes a plastic or metal material. In some embodiments, the case 600 may be omitted.

Figure 4A:
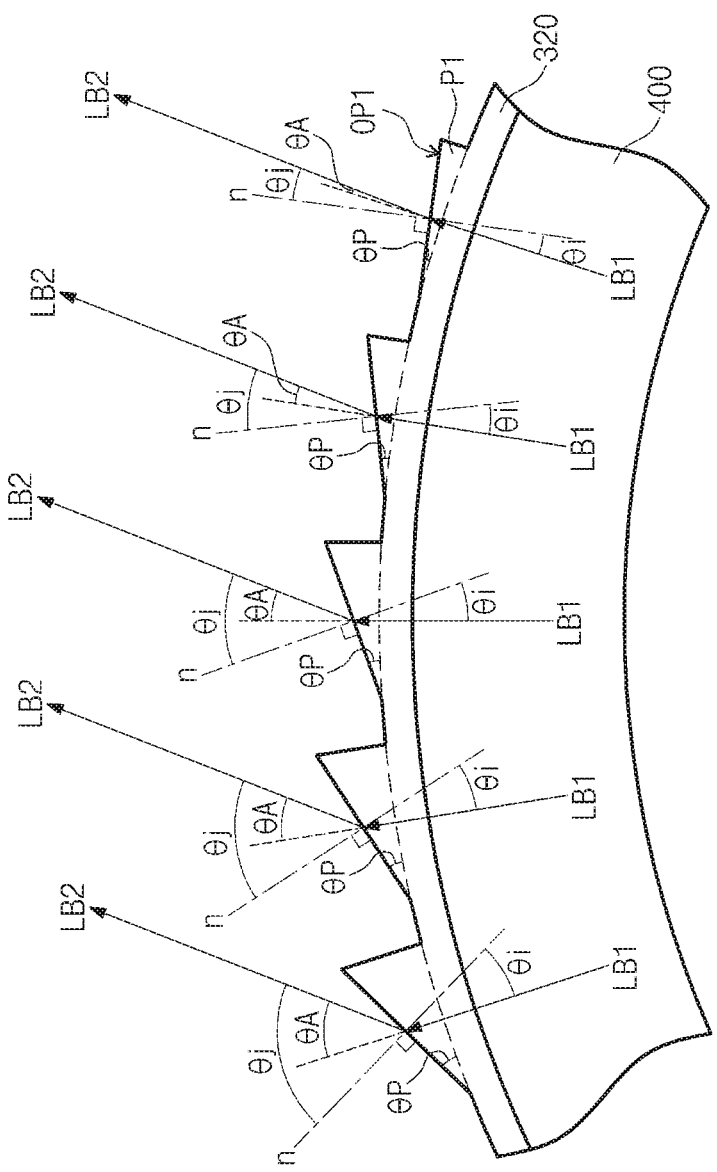
FIG. 4A is a view of a first curved sheet.
Figure 4B:
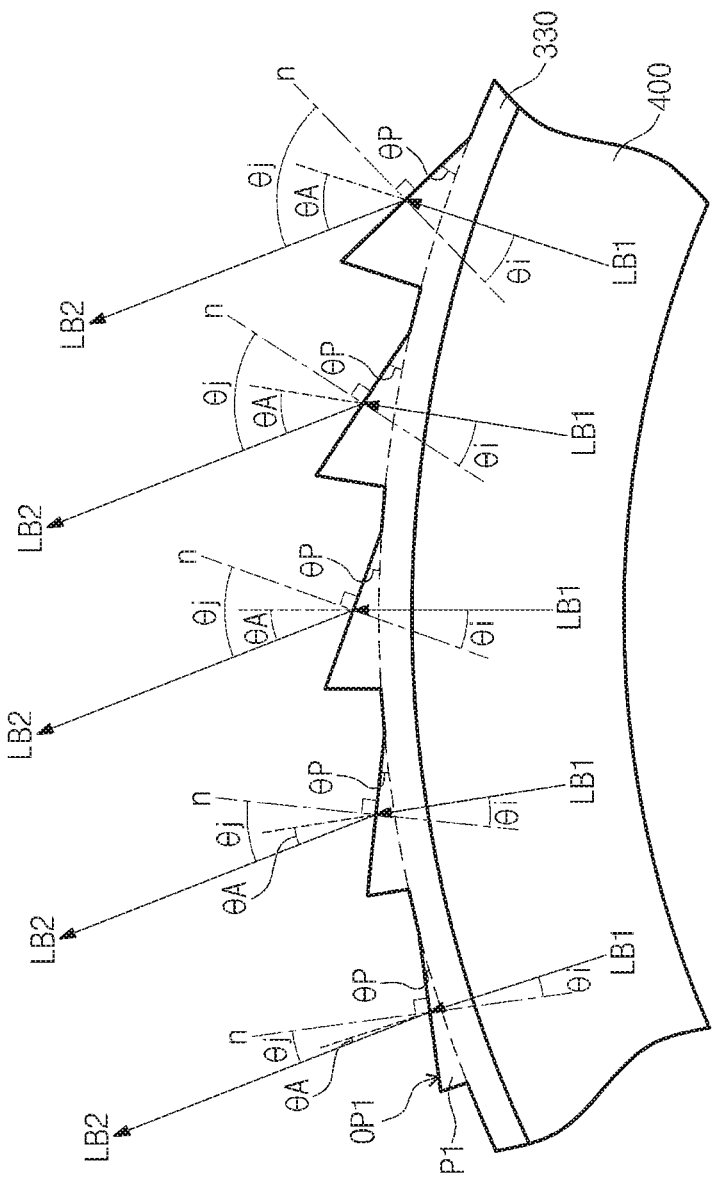
FIG. 4B is a view of a second curved sheet.

FIG. 4A is a view of the first curved part 320, and FIG. 4B is a view of the second curved part 330.

Referring to FIGS. 4A and 4B, the first optical pattern OP1 includes the first prisms P1, The first prisms P1 are arranged along a curved surface of the first and second curved parts BA1 and BA2 on the first and second curved parts 320 and 330.

The first optical pattern OP1 refracts the first light LB1 that is emitted from the display panel 400 and is incident on the first and second curved parts 320 and 330 of the optical sheet 300 (e.g., refracts the first light LB1 into a predetermined direction). The light refracted by the first optical pattern OP1 travels to the polarizing plate 200.

An angle between the direction of the first light LB1 and the direction of the second light LB2 may be referred to as a first angle $\theta A$. For example, the first optical pattern OP1 refracts the first light LB1 incident on the first optical pattern OP1 from the display panel 400 by the first angle $\theta A$.

Each of the first prisms P1 of the first optical pattern OP1 has a substantially right-angled triangular shape. For example, each of the first prisms P1 disposed on the first curved part 320 has the right-angled triangular shape with a hypotenuse side extending toward (e.g., slanted toward) one side of the display apparatus 1000 in the first direction DR1. In addition, each of the first prisms P1 disposed on the second curved part 330 has the right-angled triangular shape with a hypotenuse side extending toward (e.g., slanted toward) the other side of the display apparatus 1000 in the first direction DR1.

However, the shape of the first prisms P1 should not be limited to the right-angled triangular shape. For example, the first prisms P1 may have various shapes, such as a triangular shape, a semicircular shape, an oval shape, a polygonal shape, etc. In some embodiments, the first optical patterns OP1 may include a plurality of beads.

In some embodiments, the first prisms P1 of the first optical pattern OP1 may have different shapes from each other. For example, when an angle between the hypotenuse side of each first prism P1 and a side of the first prism P1 contacting a bottom surface of the optical sheet 300 is referred to as an inclination angle $\theta p$, the inclination angle $\theta p$ of the first prisms P1 increases in an order in which the first prisms P1 are arranged in the first direction dR1 toward an edge of the display apparatus 1000.

For example, the inclination angle $\theta p$ of the first prisms P1 disposed on the first curved part 320 increases in the order in which the first prisms P1 disposed on the first curved part 320 are arranged toward the edge of the display apparatus 1000. In addition, the inclination angle $\theta p$ of the first prisms P1 disposed on the second curved part 330 increases in the order in which the first prisms P1 disposed on the second curved part 330 are arranged toward the other edge of the display apparatus 1000.

The first prisms P1 refract the first light LB1 that is emitted from the display panel 400 and is incident on the first prisms P1 to be the second light LB2. The inclination angle $\theta p$ of each of the first prisms P1 is determined by Snell's law.

For example, the first light LB1 is incident on the first prism P1 along a direction substantially vertical with respect to (e.g., normal to) a surface at which the first prism P1 contacts the bottom surface of the optical sheet 300. Hereinafter, an angle between the first light LB1 and a normal line n normal to the hypotenuse side of each first prism P1 will be referred to as an incident angle $\theta i$. In addition, an angle between the second light LB2, obtained by refracting the first light LB1 by the first prism P1, and the normal line n will be referred to as an exit angle $\theta j$. According to the illustrated exemplary embodiment, when the first prism P1 has the right-angled triangular shape, the incident angle $\theta i$ is equal to the inclination angle $\theta p$.

When a liquid crystal layer LC has a first refractive index N1 and each first prism P1 has a second refractive index N2, a relationship between the incident angle $\theta i$ and the exit angle $\theta j$ satisfies the following Snell's law:

$$N1 \times \sin \theta i = N2 \times \sin \theta j$$

As the inclination angle $\theta p$ increases, the incident angle $\theta i$ between the normal line n and the direction of the first light LB1 increases, and the exit angle $\theta j$ increases as the incident angle $\theta i$ increases according to Snell's law.

Consequently, as the inclination angle $\theta p$ increases, the second angle $\theta 2$ between the first light LB1 and the second light LB2 increases. For example, the second angle $\theta 2$ increases in the order in which the first prisms P1 are arranged in the first direction DR1 toward the edge of the display apparatus 1000.

When the first light LB1 is emitted in a different direction than the flat surface emitting light LA by the inclination angle, a color of the light emitted through the curved parts BA1 and BA2 is distorted compared to the light emitted through the flat part FA when viewed in a front view. For example, a white angle difference (WAD) characteristic may be reduced or compromised. In other words, in the case of a display apparatus including the curved parts BA1 and BA2, brightness and color dispersion are relatively good in the curved parts BA1 and BA2 compared to the flat part FA, but the brightness is reduced and the color coordinate varies according to the observation angle. However, according to exemplary embodiments, because the first light LB1 is refracted to become the second light LB2 by the first optical pattern OP1, the light exiting (or emitted) from the curved parts BA1 and BA2 may be provided to the polarizing plate 200 along a direction substantially parallel to the flat surface emitting light LA. Accordingly, the color of the light emitted through the curved parts BA1 and BA2 may not be distorted with respect to the color of the light emitted through the flat part FA, and thus, a reduction of the brightness and a variation of the color coordinate may be reduced or prevented. As a result, the display quality of the display apparatus 1000 may be improved.

Figure 5:
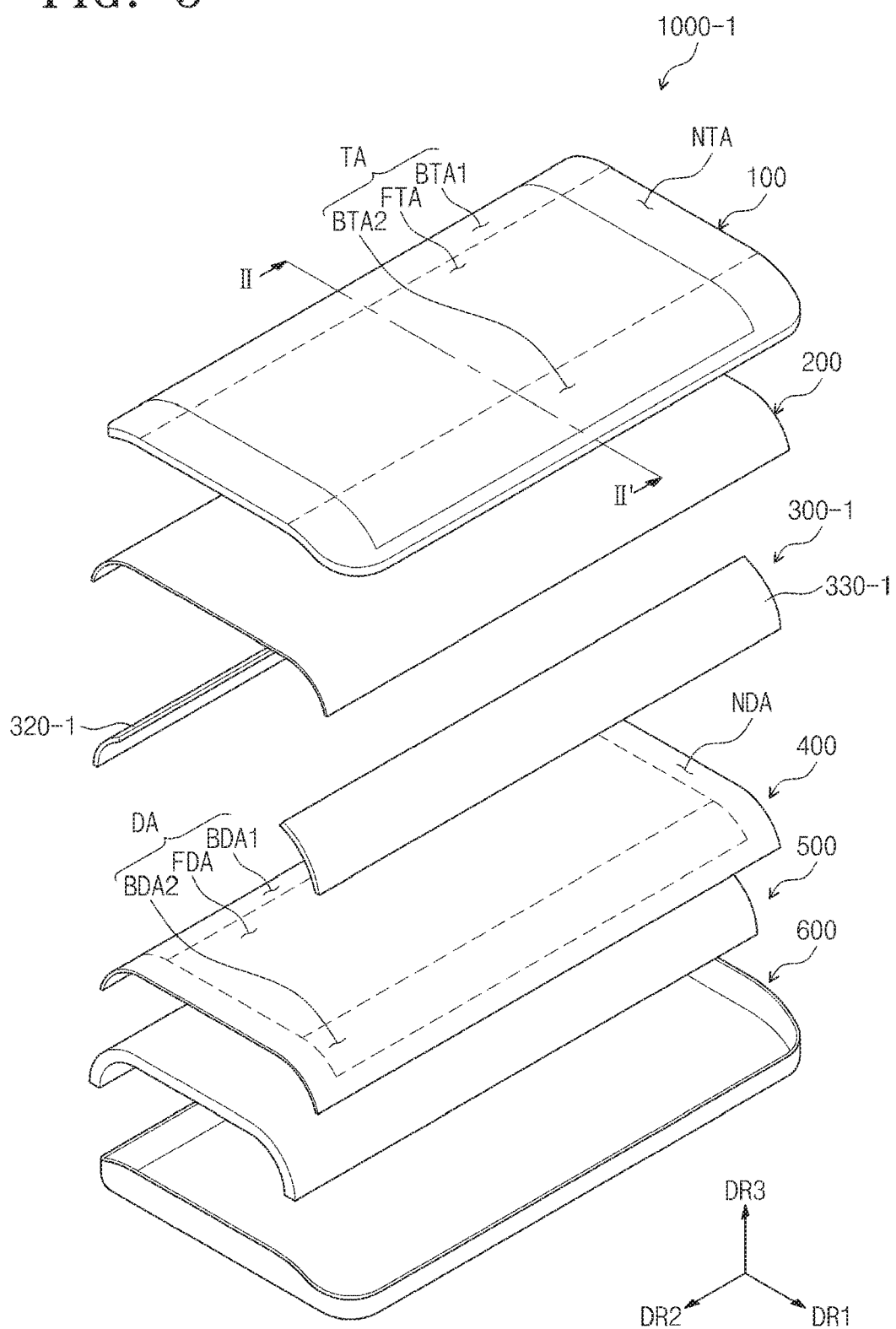
FIG. 5 is an exploded perspective view of a display apparatus according to another exemplary embodiment of the present disclosure.
Figure 6:
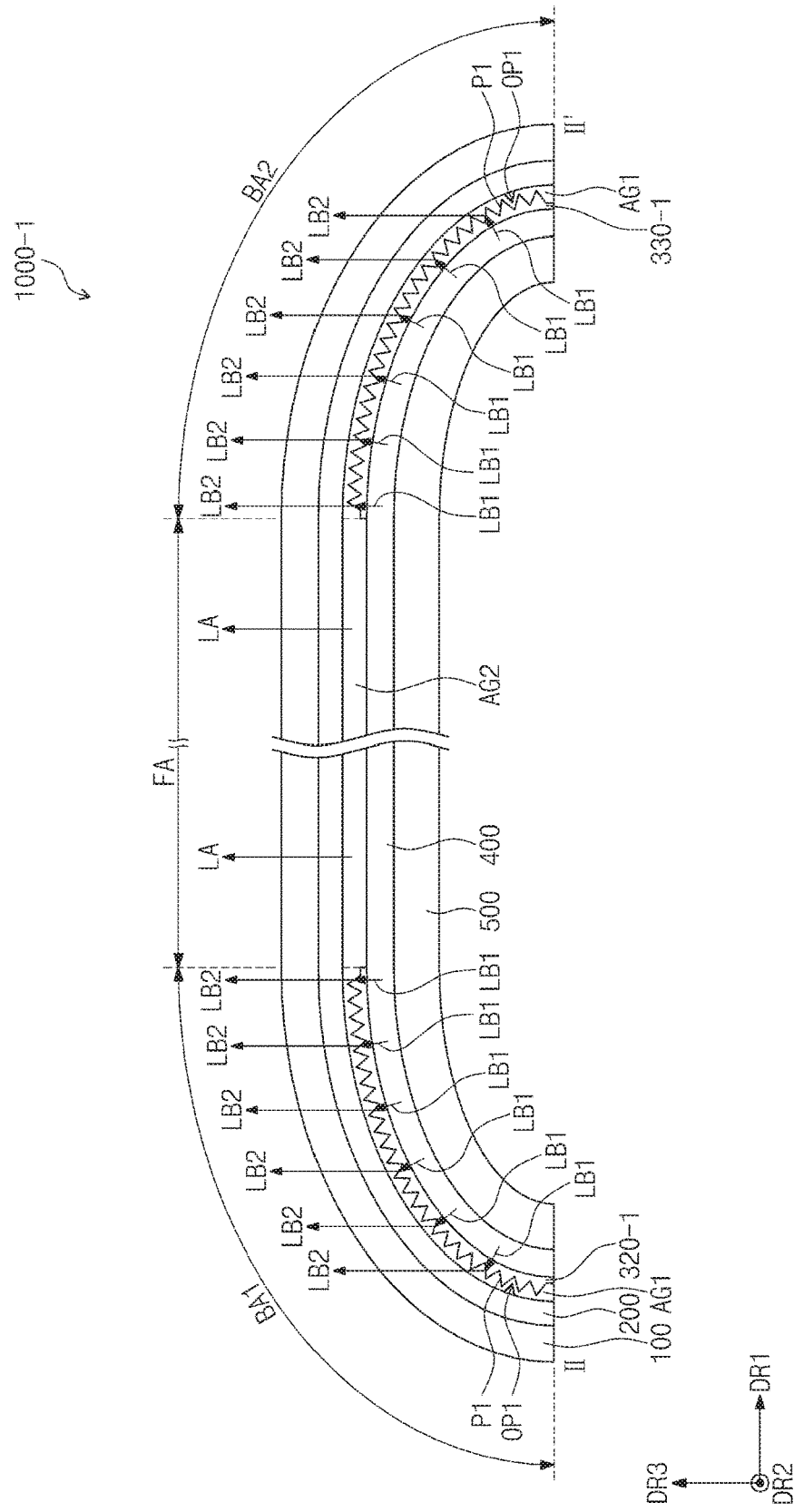
FIG. 6 is a cross-sectional view taken along the line II-II' of FIG. 5.

FIG. 5 is an exploded perspective view of a display apparatus 1000-1 according to another exemplary embodiment of the present disclosure, and FIG. 6 is a cross-sectional view taken along the line II-II' of FIG. 5. In FIGS. 5 and 6, the same reference numerals denote the same or substantially the same elements as in FIGS. 1 to 4B, and detailed descriptions of the same or substantially the same elements may be omitted.

Referring to FIGS. 5 and 6, an optical sheet 300-1 of the display apparatus 1000-1 may not include the flat part 310. For example, the optical sheet 300-1 may include only a first curved part 320-1 and a second curved part 330-1 (e.g., the optical sheet 300-1 may have constant or substantially constant curvature).

The first curved part 320-1 is spaced from (e.g., spaced apart from) the second curved part 330-1. The first curved part 320-1 is disposed in the first curved display area BDA1 of the display panel 400, in which the first curved part BA1 is arranged, and the second curved part 330-1 is disposed in the second curved display area BDA2 of the display panel 400, in which the second curved part BA2 is arranged.

A second air layer AG2 may be between the first curved part 320-1 and the second curved part 330-1 and between a portion of the display panel 400 corresponding to the flat display area FDA and the polarizing plate 200. The first and second air layers AG1 and AG2 may be filled with a filling agent, such as a transparent polymer.

Figure 7:
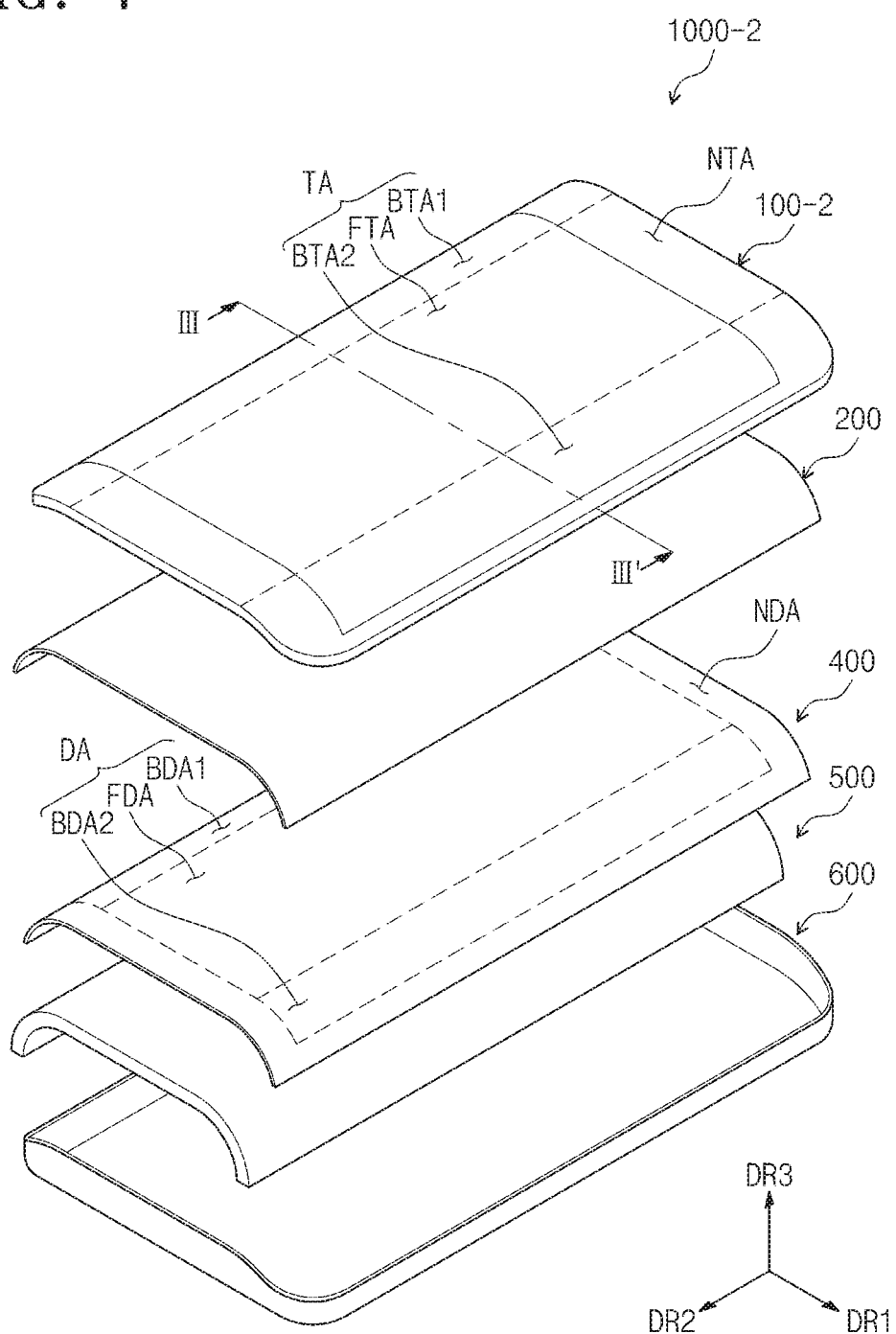
FIG. 7 is an exploded perspective view of a display apparatus according to another exemplary embodiment of the present disclosure.
Figure 8:
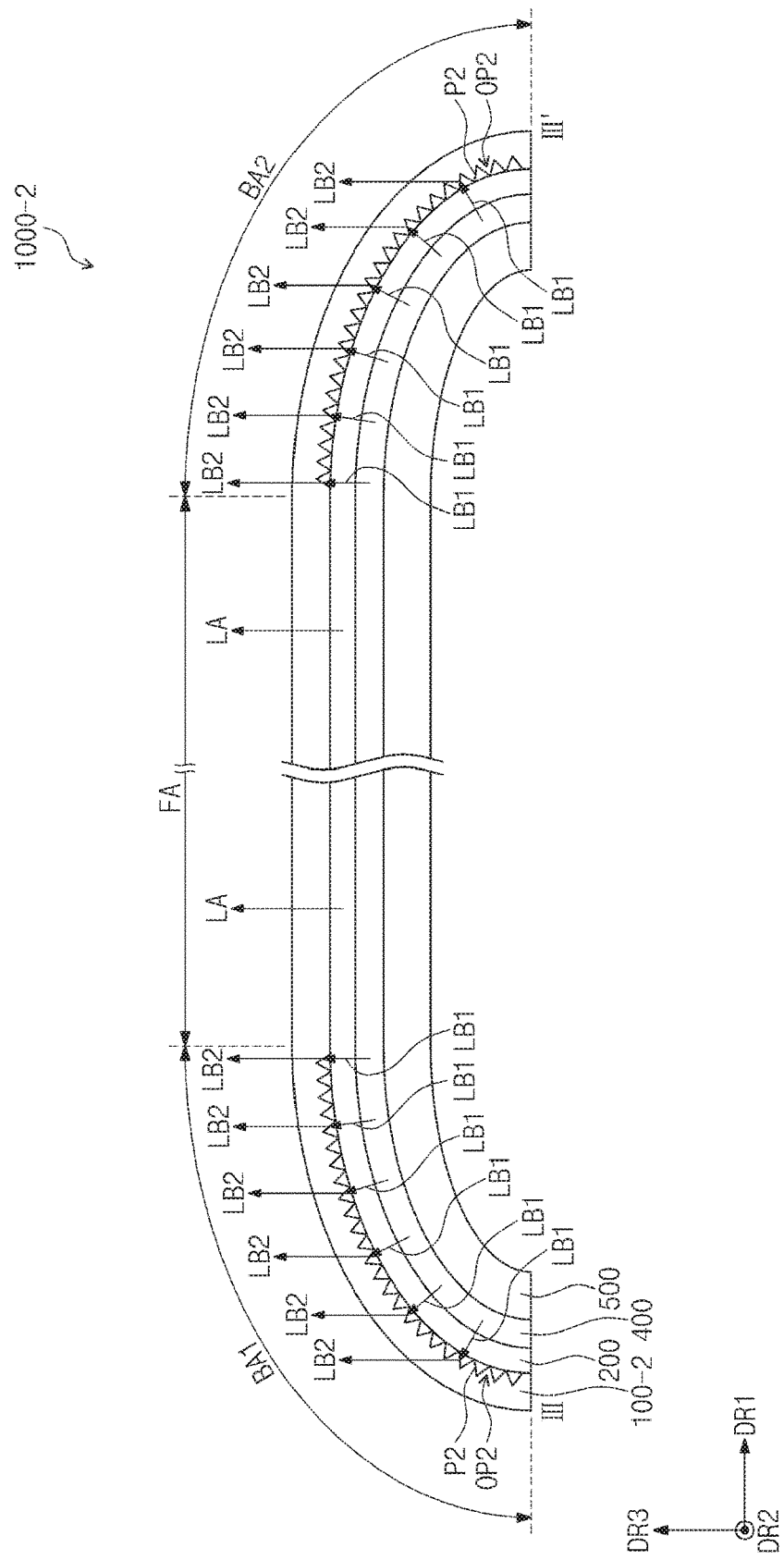
FIG. 8 is a cross-sectional view taken along the line III-III' of FIG. 7.

FIG. 7 is an exploded perspective view of a display apparatus 1000-2 according to another exemplary embodiment of the present disclosure, and FIG. 8 is a cross-sectional view taken along the line III-III' of FIG. 7. In FIGS. 7 and 8, the same reference numerals denote the same or substantially the same elements as in FIGS. 1-6, and detailed descriptions of the same or substantially the same elements may be omitted.

Referring to FIGS. 7 and 8, the display apparatus 1000-2 includes a window 100-2 (e.g., a window member), the polarizing plate 200, the display panel 400, the cover 500, and the case 600.

The window 100-2 includes a second optical pattern OP2 formed on an inner surface of the window 100-2 at an area thereof corresponding to the first and second curved light transmission areas BTA1 and BTA2. The second optical pattern OP2 refracts the first light LB1 exiting (or emitted) through the first and second curved display areas BDA1 and BDA2 on the first and second curved parts BA1 and BA2 of the display panel 400 and incident on the window 100-2.

For example, the first light LB1 and the flat surface emitting light LA are emitted from the display panel 400 and are incident on the window 100-2 after passing through the polarizing plate 200. The first light LB1 incident on the window 100-2 is refracted by the second optical pattern OP2, and the second light LB2 exiting (or emitted) from the window 100-2 travels in a direction substantially parallel to the direction of the flat surface emitting light LA.

The second optical pattern OP2 includes a plurality of second prisms P2. The second prisms P2 are disposed on the inner surface of the window 100-2 that contacts the polarizing plate 200. The second prisms P2 have an intaglio shape (e.g., the second prisms P2 are depressions in the inner surface of the window 100-2).

Figure 9A:
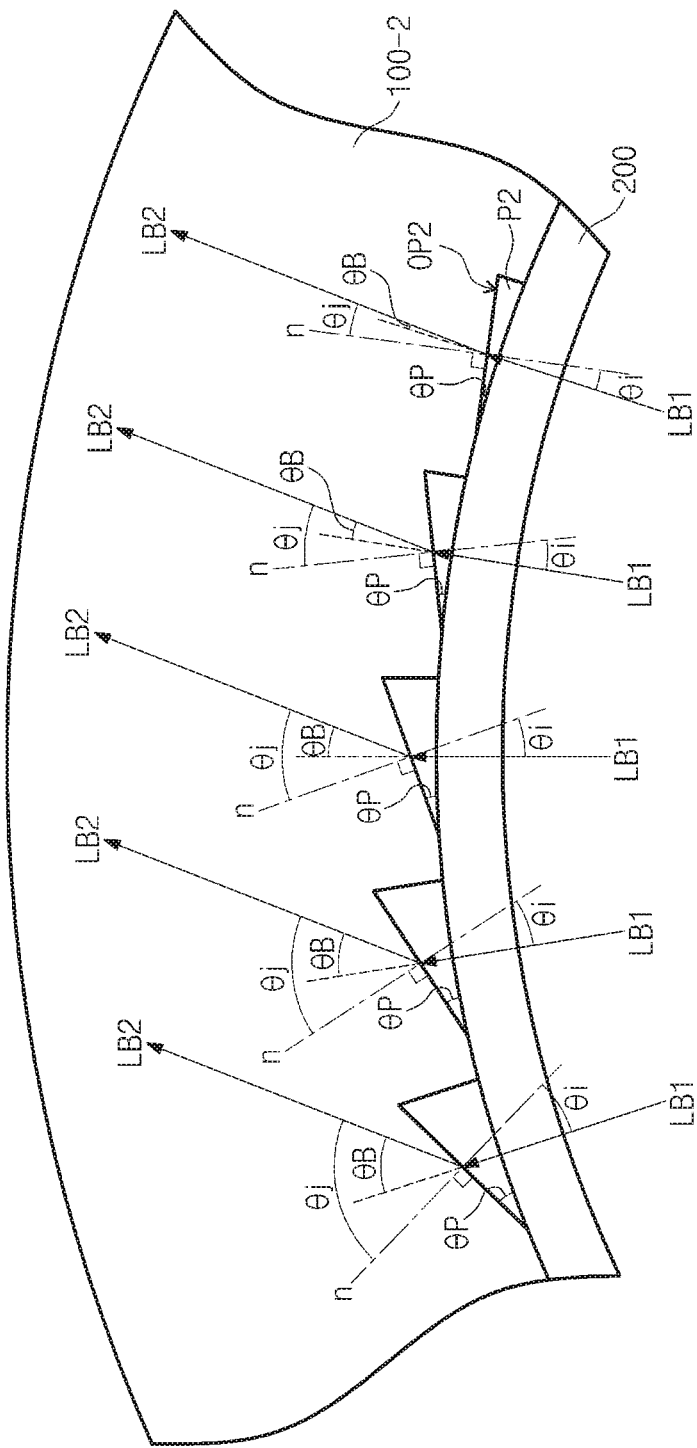
FIG. 9A is a cross-sectional view of a window corresponding to a first curved light transmitting area.
Figure 9B:
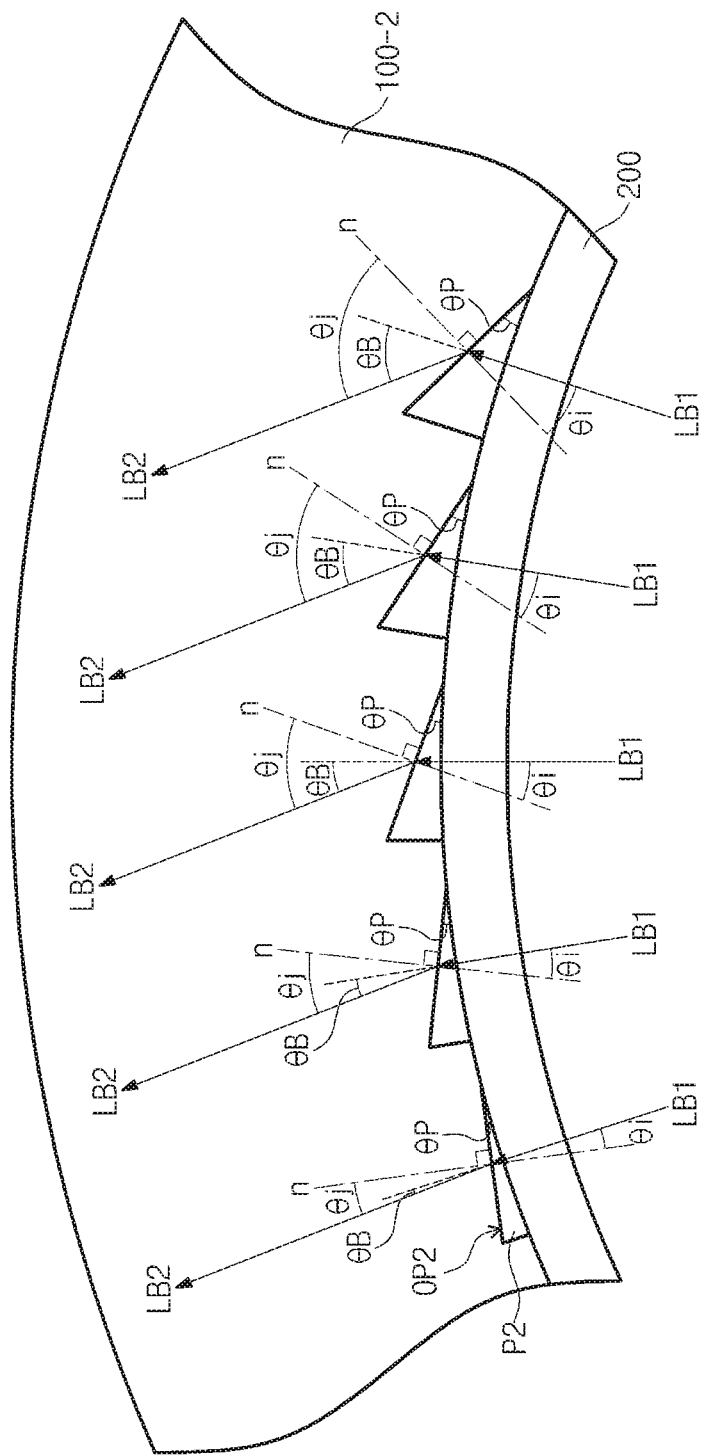
FIG. 9B is a cross-sectional view of a window corresponding to a second curved light transmitting area.

FIG. 9A is a cross-sectional view of the window 100-2 corresponding to the first curved light transmission area BTA1, and FIG. 9B is a cross-sectional view of the window 100-2 corresponding to the second curved light transmission area BTA2.

Referring to FIGS. 9A and 9B, each of the prisms P2 has a right-angled triangular shape. For example, each of the second prisms P2 in the first curved light transmission area BTA1 has the right-angled triangular shape with a hypotenuse side extending toward (e.g., slanted toward) one side of the display apparatus 1000-2 in the first direction DR1. In addition, each of the second prisms P2 in the second curved light transmission area BTA2 has the right-angled triangular shape with a hypotenuse side extending toward (e.g., slanted toward) the other side of the display apparatus 1000-2 in the first direction DR1.

The second prisms P2 of the second optical pattern OP2 may have different shapes from each other. Because the shape of the second prisms P2 is substantially the same as that of the first prisms P1 described with reference to FIGS. 4A and 4B, detailed descriptions of the shape of the second prisms P2 may be omitted.

Due to the first and second optical patterns OP1 and OP2, the color of light emitted through the curved parts BA1 and BA2 may not be distorted compared to the light emitted through the flat plate FA, and thus, the brightness and the color coordinate of the display apparatus 1000-2 may maintained. As a result, the display quality of the display apparatus 1000-2 may be improved.

Although exemplary embodiments of the present invention have been described herein, it is understood that the present invention should not be limited to these exemplary embodiments, and various changes and modifications can be made by one ordinary skilled in the art within the spirit and scope of the present invention as set forth in the following claims and their equivalents.

What is claimed is:

1. A display apparatus comprising:
a display panel configured to display an image and comprising a flat display area and a curved display area;
a window disposed over the display panel; and
an optical sheet between the display panel and the window along a light emission path of the display panel and configured to transmit light from the display panel to the window, the optical sheet comprising a first optical pattern overlapping the curved display area and configured to change a traveling direction of light exiting from the display panel and passing through the optical sheet.

2. The display apparatus of claim 1, wherein the first optical pattern comprises a plurality of first prisms.

3. The display apparatus of claim 2, wherein the display panel comprises an organic light emitting display panel.

4. The display apparatus of claim 2, wherein the first prisms are on the curved display area of the display panel and are arranged along a direction, and
wherein ones of the first prisms have shapes different from each other.

5. The display apparatus of claim 2, wherein the first prisms are on the curved display area and are arranged along a direction, and
wherein ones of the first prisms have sizes that are different from each other.

6. The display apparatus of claim 2, wherein each of the first prisms has a right-angled triangular shape.

7. The display apparatus of claim 2, wherein the curved display area is at one end of the display panel,
wherein each of the first prisms has an inclination surface inclined toward the one end of the display panel, and
wherein an inclination angle between the inclination surface and a bottom surface of the first prisms increases as a distance between the one end of the display panel and the first prisms decreases.

8. The display apparatus of claim 1, further comprising a polarizing plate between the optical sheet and the window.

9. The display apparatus of claim 8, further comprising a filling agent between the optical sheet and the polarizing plate.

10. The display apparatus of claim 1, further comprising a plurality of optical sheets,
wherein the display panel further comprises a plurality of curved display areas, and
wherein ones of the optical sheets overlap respective ones of the curved display areas.

11. The display apparatus of claim 1, wherein the display panel further comprises a plurality of curved display areas,
wherein the flat display area is between ones of the curved display areas, and
wherein the optical sheet further comprises a dummy layer on the flat display area of the display panel.

12. A display apparatus comprising:
a display panel comprising a curved display area; and
a window on the display panel along a light emission path of the display panel, the window comprising a second optical pattern on an inner surface of the window, the second optical pattern receiving light from the display panel to change a traveling direction of light exiting from the display panel,
wherein the inner surface of the window is closer to the display panel than an outer surface of the window, the outer surface being opposite to the inner surface.

13. The display apparatus of claim 12, wherein the second optical pattern has an intaglio shape.

14. The display apparatus of claim 12, wherein the second optical pattern comprises a plurality of second prisms.

15. The display apparatus of claim 14, wherein the second prisms are on the curved display area and are arranged along a direction, and
wherein ones of the second prisms have shapes different from each other.

16. The display apparatus of claim 14, wherein the second prisms are on the curved display area and are arranged along a direction, and
wherein ones of the second prisms have sizes different from each other.

17. The display apparatus of claim 14, wherein each of the second prisms has a right-angled triangular shape.

18. The display apparatus of claim 14, wherein the curved display area is at one end of the display panel,
wherein each of the second prisms has an inclination surface inclined toward the one end of the display panel, and
wherein an inclination angle between the inclination surface and a bottom surface of the second prisms increases as a distance between the one end of the display panel and the second prisms decreases.

* * * * *